(12) United States Patent
Hashmi (10) Patent No.: US 11,799,041 B2
(45) Date of Patent: Oct. 24, 2023

(54) DOUBLE SIDED SOLAR CELL ASSEMBLY

(71) Applicant: Aalto University Foundation sr, Aalto (FI)

(72) Inventor: Syed Ghufran Hashmi, Espoo (FI)

(73) Assignee: Aalto University Foundation sr, Aalto (FI)

( * ) Notice: Subject to any disclaimer, the term of this patent is extended or adjusted under 35 U.S.C. 154(b) by 0 days.

(21) Appl. No.: 17/419,755

(22) PCT Filed: Dec. 19, 2019

(86) PCT No.: PCT/FI2019/050910
§ 371 (c)(1),
(2) Date: Jun. 30, 2021

(87) PCT Pub. No.: WO2020/141252
PCT Pub. Date: Jul. 9, 2020

(65) Prior Publication Data
US 2022/0069146 A1    Mar. 3, 2022

(30) Foreign Application Priority Data

Dec. 31, 2018 (FI) .................................. 20186147

(51) Int. Cl.
*H01L 31/046* (2014.01)
*H01G 9/20* (2006.01)
(Continued)

(52) U.S. Cl.
CPC ......... *H01L 31/046* (2014.12); *H01G 9/2059* (2013.01); *H01L 31/022466* (2013.01);
(Continued)

(58) Field of Classification Search
CPC . H01L 31/046; H01L 31/048; H01L 31/0488; H01L 31/022466; H01G 9/2059;
(Continued)

(56) References Cited

U.S. PATENT DOCUMENTS

2004/0211458 A1* 10/2004 Gui .................. H01G 9/2031
136/255
2004/0251508 A1* 12/2004 Tomita ............. H01G 9/2031
257/432

(Continued)

FOREIGN PATENT DOCUMENTS

CN    105609640 A    5/2016
CN    10576268 B     8/2018

(Continued)

OTHER PUBLICATIONS

Anaya et al: ABX3 Perovskites for Tandem Solar Cells. Joule Elsevier Inc, 2017, vol. 1, pp. 769-793.

(Continued)

*Primary Examiner* — Golam Mowla
(74) *Attorney, Agent, or Firm* — Laine IP Oy; Mark W. Scott (57) ABSTRACT

The present invention relates to a double sided solar cell assembly, including at least one carbon-based perovskite solar cell unit, which has been included in a sandwich structure together with a second solar cell unit, which is a dye-sensitized photoelectrode.

16 Claims, 6 Drawing Sheets

(51) Int. Cl.
  *H01L 31/0224* (2006.01)
  *H10K 30/15* (2023.01)
  *H10K 30/00* (2023.01)

(52) U.S. Cl.
  CPC .......... *H10K 30/15* (2023.02); *H10K 30/451* (2023.02); *Y02E 10/542* (2013.01)

(58) Field of Classification Search
  CPC .... H10K 30/15; H10K 30/151; H10K 30/451; Y02E 10/542
  See application file for complete search history.

(56) References Cited

U.S. PATENT DOCUMENTS

| | | | | |
|---|---|---|---|---|
| 2009/0000655 A1* | 1/2009 | Skryabin | ............... | H01G 9/2072 136/251 |
| 2009/0211639 A1* | 8/2009 | Park | ............... | H01G 9/2072 136/262 |
| 2009/0242027 A1* | 10/2009 | Inoue | ............... | H01G 9/2072 136/256 |
| 2012/0073635 A1* | 3/2012 | Lee | ............... | H01G 9/2072 136/263 |
| 2014/0283892 A1* | 9/2014 | Lee | ............... | H01G 9/2081 438/73 |
| 2015/0136232 A1* | 5/2015 | Snaith | ............... | H10K 85/00 252/512 |
| 2015/0249170 A1* | 9/2015 | Snaith | ............... | H01L 31/1864 136/265 |
| 2015/0295194 A1* | 10/2015 | Kanatzidis | ............... | H10K 85/00 136/263 |
| 2016/0133672 A1* | 5/2016 | Koposov | ............... | H10K 30/10 136/255 |
| 2016/0329510 A1* | 11/2016 | Peet | ............... | H01L 51/0047 |
| 2017/0213651 A1 | 7/2017 | Wang et al. | | |

FOREIGN PATENT DOCUMENTS

| | | |
|---|---|---|
| CN | 108963032 A | 12/2018 |
| JP | 2013114778 A | 6/2013 |
| KR | 20160061888 A | 6/2016 |
| TW | 201039454 A | 11/2010 |

OTHER PUBLICATIONS

Chen et al: Carbon-Based Perovskite Solar Cells without Hole Transport Materials: The Front Runner to the Market?. the Market?, Advanced Materials, Jan. 21, 2017, vol. 29, No. 24, pp. 1-16.

Seong et al: Water-repellent perovskite solar cell. Journal of Materials Chemistry A. Jan. 1, 2014, vol. 2, No. 47, pp. 20017-20021.

Wikipedia: Dye-sensitized solar cell. May 24, 2005, Retrieved from the Internet: URL:https://en.wikipedia.org/wiki/Dye-sensitized_solar_cell.

Xu et al: Efficient monolithic solid-state dye-sensitized solar cell with a low-cost mesoscopic carbon based screen printable counter electrode. Organic Electronics, Dec. 29, 2012, vol. 14, No. 2, pp. 628-634.

* cited by examiner

DOUBLE SIDED SOLAR CELL ASSEMBLY

BACKGROUND OF THE INVENTION

Field of the Invention

The present invention relates to solar cells.

Particularly, the invention relates to a type of solar cell assembly that can be utilized in various applications such as building-integrated photovoltaic applications, solar parks with vertically standing panels or inclined standing panels, and also in consumer electronics for their outdoors and indoors applications.

DESCRIPTION OF RELATED ART

The solar cell market currently consists of mainly silicon-based cells. However, these are expensive alternatives, thus limiting their widespread use. During recent years, the development of other cell types has made vast progress.

A perovskite solar cell is a solar cell that includes a perovskite structured compound as the light-harvesting active layer. The perovskite structure is typically formed of an organic and an inorganic component, where the most common inorganic components are lead trihalides ($PbX_3$).

Advantages of perovskite solar cells include that they are simple to manufacture, and also have high power conversion efficiency. A disadvantage of these cells is the noble metal counter electrode that they typically require. However, recent developments in this technology have introduced the carbon electrode. Another disadvantage is their low stability. However, some of these stability issues have been found to be caused by the lead iodide residues found in these cells.

Such a perovskite solar cell including a carbon electrode has been described by Hashmi et al. (2017).

Another type of solar cells that is considered simple to manufacture is the dye-sensitized solar cell. This type of solar cell is based on a semiconducting oxide electrode (also called the anode or photoelectrode), placed in contact with a dye that absorbs sunlight. Further, this solar cell includes a conductor layer, i.e. the electrolyte, which in typical solar cells separates the oxide anode from a platinum cathode.

In addition to being simple to manufacture, such dye-sensitized solar cells require mainly cheap materials. The disadvantages thus include the challenge in replacing the platinum cathode. Other disadvantages are that the liquid electrolyte is challenging to handle and has stability problems, and that a sufficient conversion efficiency is difficult to achieve.

Such dye-sensitized solar cells have been described in several publications in the past, one version being Grätzel M. (2003).

Therefore, there exists a need for a technology that would eliminate the drawbacks of known solar cell technologies, while combining their positive features.

SUMMARY OF THE INVENTION

The invention is defined by the features of the independent claims. Some specific embodiments are defined in the dependent claims.

According to a first aspect of the present invention, there is provided a double sided solar cell assembly, including at least one perovskite solar cell unit with a carbon electrode.

According to a second aspect of the present invention, there is provided a double sided solar cell assembly including, between plates of glass or plastic, two solar cell units, at least one of which is a perovskite solar cell unit with a carbon electrode.

According to a third aspect of the present invention, there is provided a double sided solar cell assembly including, between plates of glass or plastic, one perovskite solar cell unit with a carbon electrode and one dye-sensitized solar cell unit with a photoelectrode.

The invention thus relates to a solar cell assembly including at least one solid state carbon-based perovskite solar cell, thus having a carbon electrode, which solar cell unit can be converted into a double sided solar cell assembly by sandwiching with a further solar cell unit. According to an embodiment the further solar cell unit includes a dye-sensitized solar cell unit with a photoelectrode covered with a photoactive dye and an electrolyte layer. The electrolyte can be composed of one or more completely solid state electrolytes, quasi solid state electrolytes or completely liquid electrolytes.

According to an embodiment, the carbon electrode of the perovskite solar cell will not only serve as back-contact electrode for the perovskite solar cell, but will also serve as a counter electrode for the dye sensitized solar cell.

Several advantages are achieved using a sandwich structure according to any of the above alternatives. Among others, the invention opens up new opportunities leading to new solar cell technologies.

Particularly, the double sided assembly can be fully printed, also in the case of using a dye-sensitized photoelectrode as one of the electrodes, as long as the electrolyte and the dye are selected from inkjet or screen printed alternatives.

If installed in a building wall or a window or façade, the outer carbon-based printed perovskite solar cell of the double sided solar cell can convert solar energy into electrical energy from facing the sun, whereas the inner side solar cell, being either another carbon-based perovskite solar cell or a dye-sensitized solar cell, can work efficiently by utilizing the low light intensities from inside the building.

This provides a synergistic effect, causing a highly increased efficiency of the assembly of the invention.

EMBODIMENTS OF THE INVENTION

The solar cell assembly of the present invention includes at least one solid state perovskite solar cell with a carbon electrode, which has been converted into a double sided solar cell by sandwiching with a further solar cell, which can be for example a second carbon-based perovskite solar cell or a dye-sensitized solar cell.

According to an embodiment, the solar cell assembly includes a perovskite solar cell with a carbon electrode, which has been converted into a double sided solar cell by sandwiching with:
1. A sensitized photoelectrode with different dyes, such as used in dye-sensitized solar cells, and
2. An electrolyte layer, which can be composed of one or more completely solid state electrolytes, quasi solid state electrolytes or completely liquid electrolytes or any organic or inorganic hole transport material (i.e. HTM), such as Spiro OMeTAD (or $N^2,N^2,N^{2'},N^{2'},N^7,N^7,N^{7'},N^{7'}$-octakis(4-methoxyphenyl)-9,9'-spirobi[9H-fluorene]-2,2',7,7'-tetramine), or copper iodide (CuI).

A preferred electrolyte layer is composed of one or more completely solid state electrolytes, quasi solid state electrolytes or completely liquid electrolytes having either Iodide/triiodide redox couple, Cobalt based redox couple and Copper based redox couple or any organic or inorganic hole transport material (i.e. HTM), such as Spiro OMeTAD (or $N^2,N^2,N^{2'},N^{2'},N^7,N^7,N^{7'},N^{7'}$-octakis(4-methoxyphenyl)-9,9'-spirobi[9H-fluorene]-2,2',7,7'-tetramine), or copper iodide (CuI).

The carbon electrode can be comprised of carbon black nano particles and graphite flakes which can be converted into a printable paste by adding organic binders such as ethyl cellulose and terpineol as solvent. Typically, the particles and flakes are deposited from their commercially available printable paste which contains said organic binders. After sintering at 400° C. the binders and solvent removes away from the deposited layers. It can also be formed of binder-free low temperature carbon pastes, which are also commercially available.

The carbon electrode can also be comprised of single walled carbon nanotubes or double walled or multiwalled carbon nanotubes. It can also be a composite of carbon black, graphite and carbon nanotubes (single double or multiwalled). It can also be graphene based printable paste. Typically, the graphene forms a layer that has been deposited from its commercially available printable paste.

In some embodiments, the carbon electrode of the perovskite solar cell will not only serve as back-contact electrode for the perovskite solar cell unit, but will also serve as a counter electrode for the second solar cell unit, such as the dye sensitized solar cell unit, thus replacing the platinum electrode of common dye-sensitized solar cells.

According to an embodiment, the carbon-based perovskite solar cell unit comprises:
1. a transparent substrate, such as glass or plastic, such as flexible plastic;
2. a transparent conductive layer, such as a coating, on the substrate to form transparent conductive electrodes on the transparent substrate;
3. a compact electron selective layer on one of the electrodes, such as a layer of $TiO_2$;
4. a mesoporous electron selective layer on the compact electron selective layer, such as a mesoporous layer of $TiO_2$;
5. an insulating layer, such as a layer of $ZrO_2$;
6. an electrode layer comprising carbon; and
7. perovskite infiltrated at least into the electron selective layers (compact and mesoporous $TiO_2$) to create crystals in these layers.

The transparent substrate can be selected from glass or plastic, such as flexible plastic, or tempered glass. The glass tempering process may be easily implemented during the fabrication sequence of the double-sided solar cell assembly (see FIG. 2). More specifically, the glass tempering processing can be implemented after Step 6 described in FIG. 2 in case the low temperature (100-150° C.) carbon paste is used to produce carbon electrode or the glass tempering step can also be implemented after Step 7 described in FIG. 2 (see FIG. 2). Similarly the tempering of photoelectrode can be done before the dye sensitization step.

Figure 1:
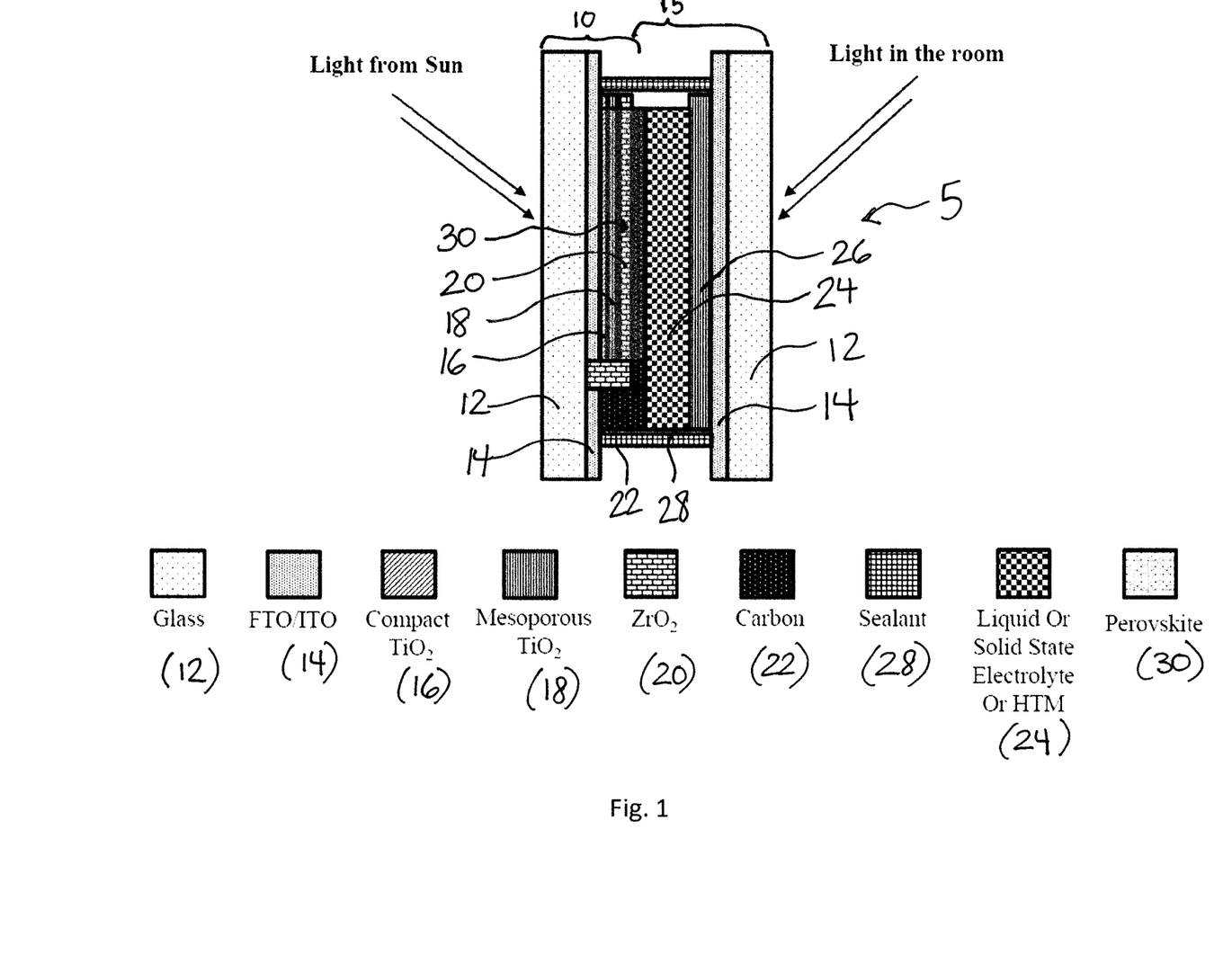
FIG. 1 illustrates a structure of the solar cell assembly of the present invention in accordance with at least some embodiments of the present invention.

According to an embodiment of FIG. 1, the double sided solar cell assembly 5 includes a first solar cell unit 10 comprising:
8. a transparent substrate 12 with a conducting surface layer 14, which is formed by an FTO glass substrate (fluorine doped tin oxide glass substrate) or a glass substrate covered by a layer of indium tin oxide (ITO),
9. a compact titanium dioxide layer ($TiO_2$) 16 infiltrated by perovskite 30 on the surface of the conductive surface layer 14,
10. a mesoporous $TiO_2$ layer 18 infiltrated by the perovskite 30 on the surface of the compact $TiO_2$ layer,
11. an insulating zirconium dioxide layer ($ZrO_2$) 20 infiltrated by the perovskite 30 on the surface of the mesoporous $TiO_2$ layer,
12. a carbon electrode layer 22 infiltrated by the perovskite 30 on the surface of the insulating $ZrO_2$ layer 20, and
13. a second solar cell unit 15 sharing a common electrode with the first solar cell unit, i.e. the carbon electrode formed by the carbon electrode layer 22, the second solar cell unit 15 further comprising:
14. a layer 24 of electrolyte or hole transporting material (HTM) on the surface of the carbon electrode layer,
15. a dyed $TiO_2$ layer 26 on surface of the layer 24 of electrolyte or hole transporting material, the dyed $TiO_2$ layer 26 containing a photosensitizer dye, and
16. another transparent substrate 12 with a conducting surface layer 14 on the dyed $TiO_2$ layer 26 such that the conducting surface layer faces the dyed $TiO_2$ layer, wherein the transparent substrate 12 with a conducting surface layer can be formed by an FTO glass substrate or a glass substrate covered by a layer of indium tin oxide (ITO), and
17. optionally a sealant 28 for enclosing at least some of the layers in the layer structure between the transparent substrates.

According to an embodiment of FIGS. 5a-b, the double sided solar cell assembly includes a first solar cell unit comprising:
8. a transparent substrate 12 with a conducting surface layer 14, which is formed by an FTO glass substrate (fluorine doped tin oxide glass substrate) or a glass substrate covered by a layer of indium tin oxide (ITO),
9. a compact titanium dioxide layer ($TiO_2$) 16 infiltrated by perovskite on the surface of the conductive surface layer,
10. a mesoporous $TiO_2$ layer 18 infiltrated by the perovskite on the surface of the compact $TiO_2$ layer 16,
11. an insulating zirconium dioxide layer ($ZrO_2$) 20 infiltrated by the perovskite 30 on the surface of the mesoporous $TiO_2$ layer 18,
12. a carbon electrode layer 22 infiltrated by the perovskite 30 on the surface of the layer insulating $ZrO_2$ layer 20, and 13. a hydrophobic or superhydrophobic layer 36 on the surface and edges of carbon electrode 22 and also around the edges of other active layers, and
14. an insulating layer 38 (such as layer of organic binder e.g. Ethyl Cellulose containing $ZrO_2$ or $Al_2O_3$) on the surface and around the edges of hydrophobic or superhydrophobic layer 36, and
15. the second carbon electrode layer 22 can be deposited either via screen printing or inkjet printing or slot die coating on the surface of insulating layer 38 and is further extending on the surface of FTO layer or ITO layer on transparent glass of the first solar cell unit to serve as conductor and counter electrode of second solar cell unit (FIG. 5a-b), which is further comprising,
16. a layer of electrolyte or hole transporting material 24 on the surface of the second carbon electrode layer 22,
17. a dyed $TiO_2$ layer 26 on surface of the layer of electrolyte or hole transporting material 24, the dyed $TiO_2$ layer 26 containing a photosensitizer dye, and
18. another transparent substrate 12 with a conducting surface layer 14 on the dyed $TiO_2$ layer such that the conducting surface layer faces the dyed $TiO_2$ layer, wherein the transparent substrate with a conducting surface layer can be formed by an FTO glass substrate or a glass substrate covered by a layer of indium tin oxide (ITO) 12, 24, and
19. optionally a sealant 24 and glass cover 32 for enclosing drilled holes of the transparent glass of the second solar cell unit can be done, in case of using liquid electrolytes. The holes can be drilled whenever it is needed on the FTO glass of second solar cell unit.

The insulating layer can also be extended on the FTO or ITO layers on the surface of the transparent glass of second solar unit for avoiding the possible leakage of liquid electrolytes.

The super hydrophobic layer 36 and insulating layer 38 can also be sandwiched between the carbon electrode of the perovskite solar cell unit and the carbon electrode of a monolithic dye-sensitized solar cell structure representing second solar cell unit (FIG. 5b).

FIG. 1, as well as FIGS. 5a-b, shows also sealant material for enclosing the layers between the conducting surface layers on the transparent substrates. Thus, the active layers between the outermost electrodes formed by the two conducting surface layers are protected against the environment (against humidity for instance) by the transparent substrates from the direction of the major faces of the assembly and by the sealant material from the direction of the edge areas between the transparent substrates. When using a liquid state electrolyte, the sealant also prevents the electrolyte from leaking out of the device.

To further obtain the contacts, the silver conductor can also be printed over FTO layers of each transparent substrates.

According to an embodiment, the first transparent substrate and the first conducting layer can be formed as an FTO glass substrate (fluorine doped tin oxide glass substrate) and/or is covered by indium tin oxide (ITO).

Such a structure, as shown in FIG. 1, can be completely manufactured by printing. As becomes evident from FIG. 2, also a structure including only carbon-based perovskite solar cell units can be manufactured by printing, and also the structure of FIG. 5 can be manufactured by printing.

Figure 2:
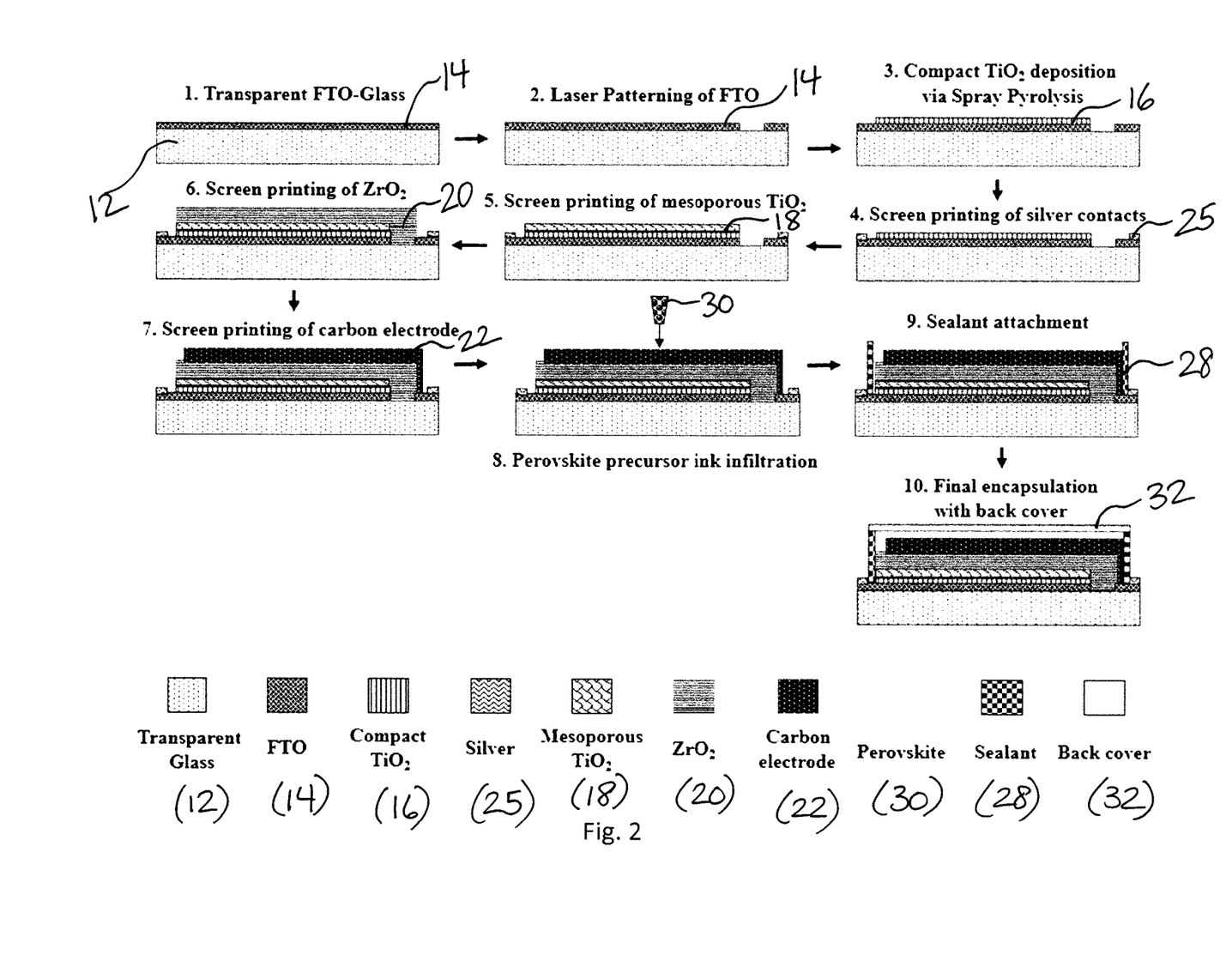
FIG. 2 illustrates a preferred method for fabricating the perovskite solar cell unit of the assembly according to an embodiment of the present invention, using printing technology.

The method of FIG. 2 comprises the steps of:
1. obtaining a transparent FTO glass substrate 12,
2. laser patterning the conductive coating 14 on the transparent FTO glass substrate in order to separate an electrode pattern,
3. depositing a compact titanium dioxide layer ($TiO_2$) 16 via Spray Pyrolysis or screen printing or inkjet printing,
4. screen printing silver contacts 25 on the side areas of the conductive coating for creating contact pads for electrical contacts of the device,
5. screen printing a mesoporous $TiO_2$ layer 18,
6. screen printing an insulating zirconium dioxide layer ($ZrO_2$) 20, and
7. screen printing a carbon electrode layer 22, and
8. infiltrating perovskite precursor ink 30 into the layer structure, e.g. by inkjet infiltration.

When making double-sided solar cell assemblies the method of FIG. 2 is continued after step 8 by the manufacture of the second solar cell unit on the surface of the carbon electrode layer. Hence, the method comprises additional steps between the steps 8 and 9 shown in FIG. 2. The final encapsulation step 10 can also be replaced by the manufacture of the second solar cell unit. The sealant can be attached in any appropriate phase in the method.

According to an embodiment, the manufacture of the second solar cell unit 15 comprises:
11. printing or depositing a layer of electrolyte or hole transporting material on the surface of the carbon electrode layer,
12. fabricating a dyed $TiO_2$ layer on a conductive layer of an FTO glass substrate or a glass substrate covered by a layer of indium tin oxide (ITO), and
13. attaching the substrate on surface of the layer of electrolyte or hole transporting material, or on the surface of the carbon electrode layer, if the electrolyte or hole transporting material has been absorbed or adsorbed by the carbon electrode layer, such that the dyed $TiO_2$ layer faces the layer of electrolyte or hole transporting material, and
14. optionally enclosing at least some of the layers in the layer structure between the transparent substrates by a sealant.

According to an alternative embodiment, the manufacture of the second solar cell unit comprises
11. printing or depositing a layer of super hydrophobic coating 36 over the carbon electrode layer of perovskite solar cell unit,
12. printing or deposition of insulating layers 38 of either $ZrO_2$ or $Al_2O_3$ containing ethyl cellulose binders from commercially available printable pastes as an example.
13. printing second carbon electrode 22 to serve as conductor and counter electrode of dye-sensitized solar cell (second solar cell unit).
14. printing a layer of electrolyte 24 (in case quasi solid or ionic liquid electrolyte or hole transporting material)
15. fabricating photoelectrode of the dye-sensitized solar cell by fabricating first a compact $TiO_2$ 16 by treating the conductive FTO layer 14 facing Glass 12 with $TiCl_4$ solution at 70° C. for 30 minutes followed by first rinsing the FTO-Glass substrate with deionized water and then rinsing with the ethanol and drying the FTO Glass substrate, and sintering the FTO-Glass at 500° C. for 30 minutes followed by cooling the treated glass to room temperature, and
16. fabricating a nanocrystalline mesoporous $TiO_2$ layer 40 (see FIGS. 5a-b) on the compact $TiO_2$ layer 16 facing conductive layer of a FTO glass substrate or a glass substrate covered by a layer of indium tin oxide (ITO), followed by sintering the FTO-Glass at 500° C. for 30 minutes and cooling it down to room temperature.
17. fabricating an opaque, scattering mesoporous $TiO_2$ layer 42 (see FIGS. 5a-b) on the mesoporous nanocrystalline $TiO_2$ layer, 40 followed by sintering the layer at 500° C. for 30 minutes followed by cooling it down to room temperature, after that.
18. Performing second $TiCl_4$ treatment followed by rinsing with deionized water first and then rinsing with the ethanol and drying the FTO Glass substrate containing both compact $TiO_2$ and mesoporous $TiO_2$ layers, and
19. Sensitizing the compact $TiO_2$ and nanocrystalline mesoporous $TiO_2$ and opaque scattering $TiO_2$ layers 40, 42 in the dye solution preferably in the dye bath but other printing of dye method can be used such as inkjet printing.
20. washing the dyed photoelectrode with appropriate solvent and drying, and
21. attaching this photoelectrode on surface of the layer of electrolyte or hole transporting material, or on the surface of the carbon electrode layer, if the electrolyte or hole transporting material has been absorbed or adsorbed by the carbon electrode layer, such that the dyed $TiO_2$ layers faces the layer of electrolyte or hole transporting material, and
22. optionally enclosing at least some of the layers in the layer structure between the transparent substrates by a sealant.
23. The electrolyte can also be introduced through drilled holes on the FTO-coated Photoelectrode Glass substrate after attaching the photoelectrode, in case the printing of the electrolyte as described in step 14 has been avoided.
24. The holes can be sealed preferably with thermoplastic and thin cover glass by applying hot press.
25. Printing of silver at the edges of the FTO-Glass substrate to produce contacts.
26. Printing of silver at the edges of the FTO-Glass can be postponed to obtained serially connected cells for both solar cell units and can be applied in the end for both solar cell units.

Figure 3:
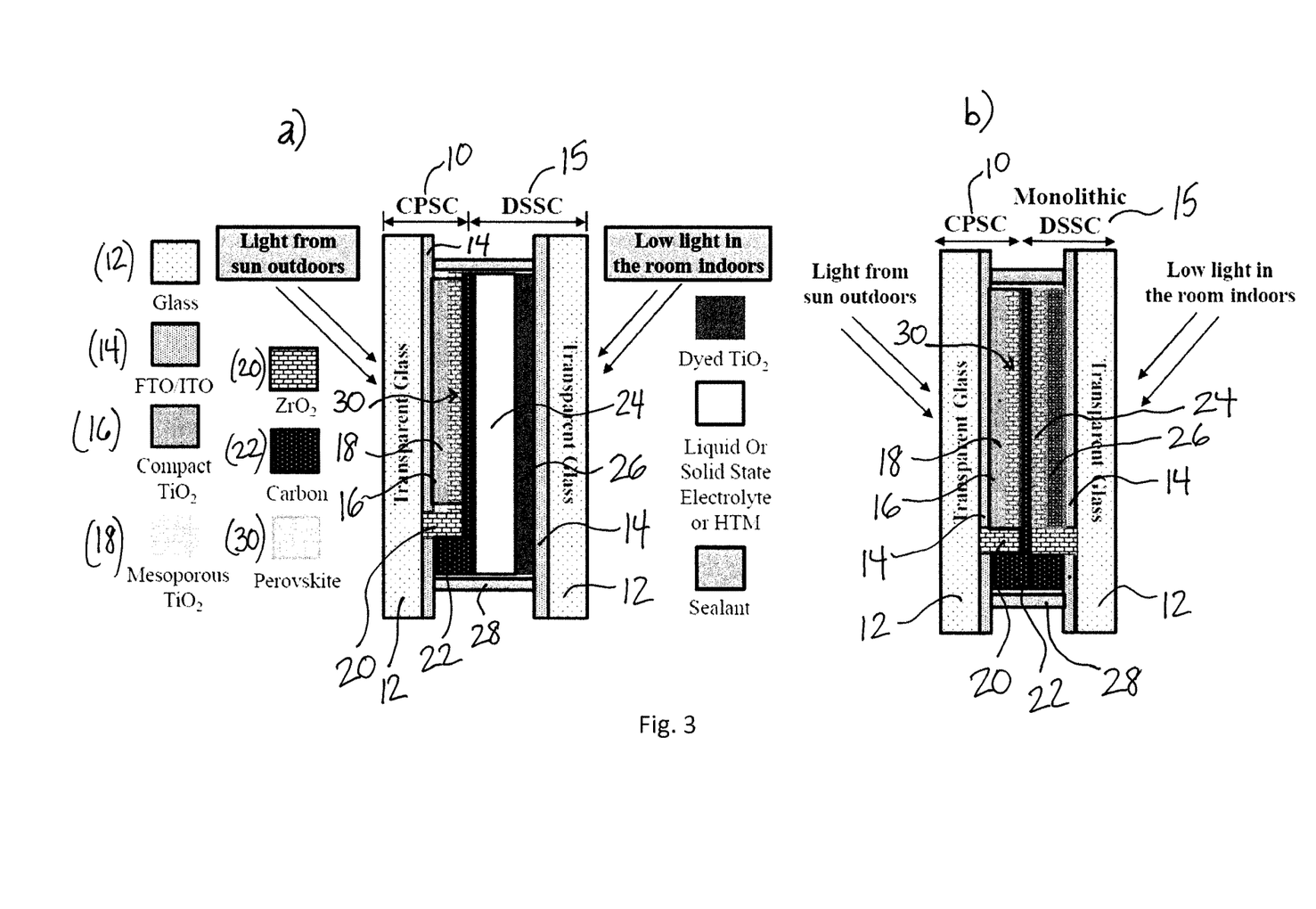
FIGS. 3a-b illustrate structures of the solar cell assembly of the present invention in accordance with at least some embodiments of the present invention.

FIG. 1 shows a Double Sided Solar Cell with Carbon based printed Perovskite Solar Cell (CPSC) and Dye-sensitized solar cell (DSSC). FIGS. 3a-b shows two modifications of the structure of FIG. 1. The assembly of FIG. 3b on the right side of the figure comprises a monolithic DSSC, which keeps the same device structure as a CPSC, and can share the same carbon electrode of the CPSC along with a compatible electrolyte which does not dissolve the perovskite light absorbing molecule.

Figure 5:
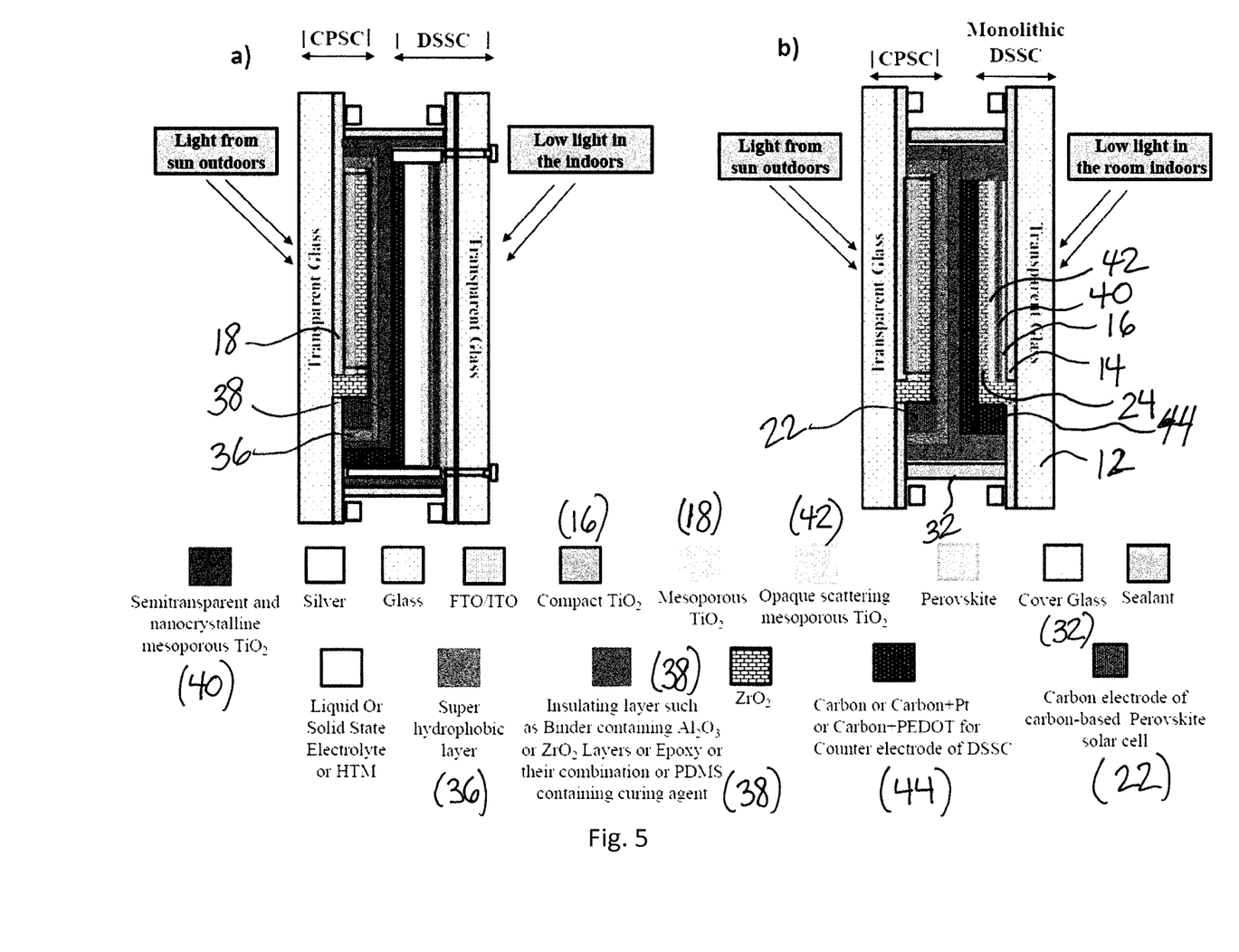
FIGS. 5a-b illustrate further structures of the solar cell assembly of the present invention in accordance with at least some embodiments of the present invention.
Figure 6:
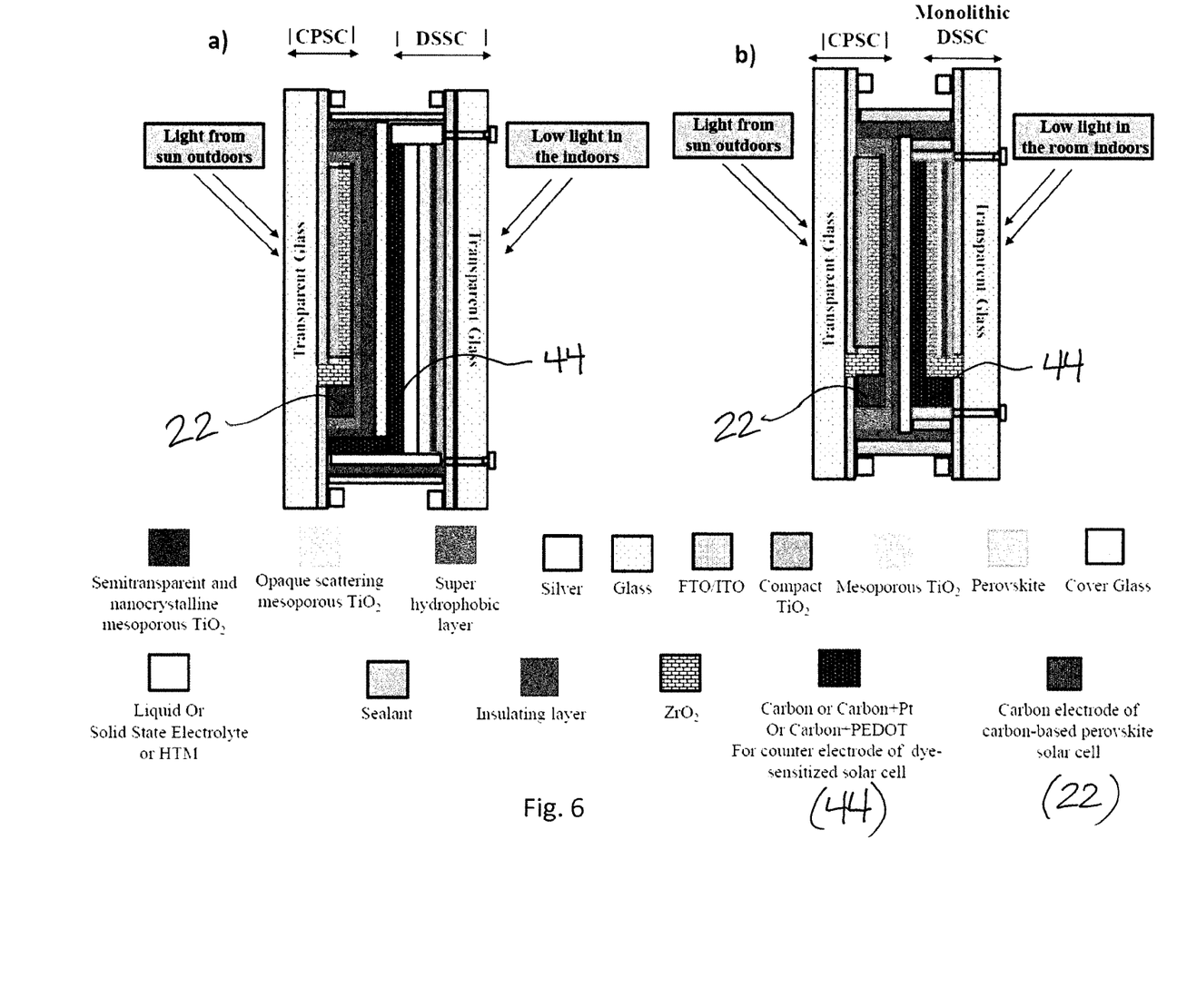
FIGS. 6a-b illustrate further structures of the solar cell assembly of the present invention in accordance with at least some embodiments of the present invention.

Likewise, FIG. 5(a-b) shows two variants of Double Sided Solar Cell with Carbon based printed Perovskite Solar Cell (CPSC) and Dye-sensitized solar cell (DSSC). FIGS. 6a-b show two more structures derived from the structures of FIG. 5(a-b). The assembly of FIG. 5b and FIG. 6b) comprises a monolithic DSSC, which keeps the same device structure as a CPSC.

Thus, the solar cell assemblies of FIGS. 5a-b and 6a-b include multiple electrode layers between the transparent substrates.

In some embodiments, the monolithic DSSCs can be replaced with a solid-state dye-sensitized solar cell as described by I. Benesperi et al and can also have a compact $TiO_2$ layer produced by spray-pyrolysis process.

Figure 4:
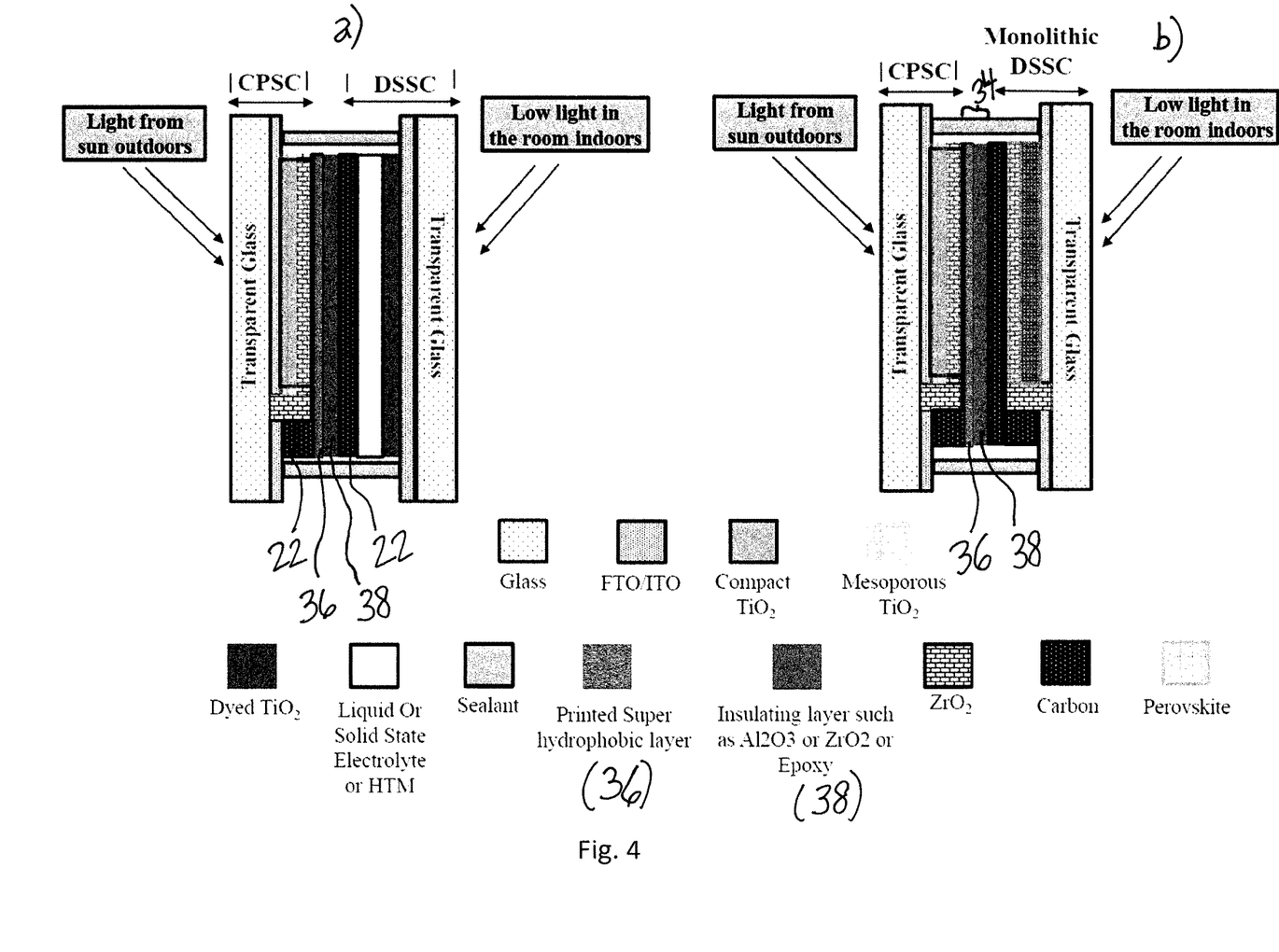
FIGS. 4a-b illustrate further structures of the solar cell assembly of the present invention in accordance with at least some embodiments of the present invention.

FIGS. 4a-b show two more variants of the novel double sided solar cell, which can be produced by integrating super hydrophobic coating, which according to one option can be replaced by a hydrophobic coating, first on the carbon electrode of the Carbon based printed perovskite solar cell (CPSC) followed by printing insulating layer or even a layer of epoxy on it. After that a carbon conducting layer can be printed over insulating layer. This strategy will allow more isolation of perovskite light absorbing layer in case we use a liquid or quasi solid ionic liquid electrolytes for these novel structures. In the embodiments of FIGS. 4a-b, the both solar cells include their own separate electrodes, whereas in the embodiments of FIG. 1 and FIGS. 3a-b, the first and second solar cells share a common electrode, i.e. the carbon electrode at the interface between the two solar cell units. Thus, the solar cell assemblies of FIG. 4 include four electrode layers between the transparent substrates and the solar cell assemblies of FIGS. 1 and 3 include three electrode layers between the transparent substrates. In the solar cell assemblies of FIGS. 4a-b, the first and second solar cell units both comprise a carbon electrode 22, which carbon electrodes are separated by an insulating layer 34. In the embodiments of FIGS. 4a-b, this insulating layer 34 comprises a layer 36 of printed super hydrophobic material as well as a layer 38 of an insulating material such as $Al_2O_3$, $ZrO_2$ or epoxy.

As indicated above, it is preferred that one of the units of said solar cell assembly is a dye-sensitized solar cell unit with a photoelectrode, similar to the electrode structures found in dye-sensitized solar cells. Such solar cells include an anode consisting of a glass plate which is coated with a transparent conductive oxide film. The preferred glass plate is a fluorine-doped tin oxide glass substrate, onto which a transparent, conductive and highly porous layer of titanium dioxide ($TiO_2$) has been applied.

Preferably, the dye-sensitized photoelectrode has been formed from an FTO glass substrate, covered by a layer of compact $TiO_2$, such as compact $TiO_2$ produced with $TiCl_4$ treatment, followed by a layer of mesoporous $TiO_2$, which in turn has been soaked with a photosensitizer dye.

This anode has been soaked with a solution of a photoactive dye, or a photosensitizer, which thus has bonded to the porous $TiO_2$.

The photosensitizer dye coated onto the photoactive electrode is selected from those containing pigments which are also able to convert light energy into electrical energy. Suitable alternatives include the commercial dyes Y123, XY1b, LEG4, N719, C101 and C106.

In case the second electrode of the assembly is a dye-sensitized electrode, an electrolyte is required between the anode and the cathode. As stated above, this electrolyte can be completely liquid, quasi-solid or completely solid as well as hole transporting material for example Spiro OMeTAD. Several liquid electrolytes are available on the market, e.g. various iodides, typically with Iodide/triiodide redox shuttles, Copper based redox shuttles or cobalt based redox shuttle. Quasi-solid or completely solid electrolytes are typically achieved by modification of the liquid alternatives. The hole transporting materials are also commercially available.

The redox shuttles for liquid electrolytes, semi solid electrolytes, quasi solid electrolytes, gel electrolytes or completely solid electrolytes are from iodide/triiodide redox couple, Cobalt based redox couple and Copper based redox couples such as presented by H. Petterson et al, G. Hashmi et al, A. Yella et al, Marina et al and Yiming Cao et al.

An example of a known quasi-solid electrolyte, i.e. an electrolyte in gel form, is a 3-methoxypropionitrile-based liquid electrolyte that has been solidified by a photochemically stable polymer, e.g. polyvinylidenefluoride-co-hexafluoropropylene. Completely solid electrolytes can be achieved, for example through nanotechnology, or by introducing an inert ceramic phase.

The liquid electrolyte materials are selected from those solvents, which do not dissolve the perovskite light absorbing layer, such as Iso Propanol or Chlorobenzene.

The sealant materials, used optionally to enclose the electrolyte, can be a thermoplastic such as Surlyn or Bynel thermoplastics or a double sided common scotch tape or a double sided pressure sensitive tape Scotch™ or a screen printable epoxy. A preferred material is thermoplastic. Other possible options include UV curable epoxy or polydimethylsiloxane (PDMS), e.g. in the form of a curing agent. Alternatively, a solid state electrolyte layer can be used, which does not allow short circuiting, and which provides the opportunity to realize a completely solid double sided solid state solar cell, as described in Yiming Cao et al. (2018). It is also possible to use a solid hole conductor as described in Marina Freitag et al. (2015). Such a completely solid solar cell can provide a highly efficient light-to-energy conversion in a unique way.

The cathode (also called as counter electrode) of a typical dye-sensitized solar cell is a glass plate with a thin platinum film which serves as a catalyst. However, in the present invention, this platinum cathode has been replaced by the carbon electrode of a perovskite solar cell unit. Nevertheless, the Pt can also be printed over carbon electrode. Typically, this Pt-coated carbon electrode (see e.g., electrode 44 in FIGS. 6a-b) forms the counter electrode of the dye-sensitized solar cell unit, whereas the perovskite solar cell needs an electrode formed of pure carbon (see FIGS. 6a-b). Other catalyst materials such as PEDOT (or Poly(2,3-dihydrothieno-1,4-dioxin)-poly(styrenesulfonate)) can also be printed or deposited over carbon electrode to make it more catalytic. Even PEDOT can be directly casted on the sensitized photoelectrode of the Dye sensitized solar cells and can be directly attached over carbon electrode of carbon based printed perovskite solar cells.

This perovskite solar cell unit (see fabrication in FIG. 2) includes several layers of materials, formed by first depositing a compact layer of $TiO_2$ on a fluorine doped tin oxide (FTO) glass substrate, followed by applying silver contacts for the carbon electrode. Subsequently, a layer of mesoporous $TiO_2$ was applied onto the compact $TiO_2$ layer, as well as an insulating mesoporous $ZrO_2$ layer. Finally, the conductive porous carbon electrode was fabricated onto the silver contacts, whereafter the perovskite could be added by infiltration of a perovskite precursor solution into the fabricated porous stack.

The compact layer of $TiO_2$ deposited on the FTO glass substrate typically has a thickness of 30-40 nm. The deposition typically takes place by spray pyrolysis of a solution of titanium diisopropoxide bis(acetylacetonate) over an etched FTO glass substrate but can also be deposited via screen printing by using commercially available compact $TiO_2$ paste.

The mesoporous $TiO_2$ layer, on the other hand, is typically a thick layer of about 500 nm, and obtained by screen-printing. Similarly, the mesoporous $ZrO_2$ layer is obtained by screen-printing and by stacking 1-4 prints before sintering, in order to obtain a suitable thickness of an insulating layer.

The carbon electrode can likewise be obtained by screen-printing a carbon paste onto the $ZrO_2$ layer.

The perovskite is typically an organic-inorganic perovskite, which can be based on an organic or inorganic cation (for example: methyl-ammonium $CH_3NH_3^+$, ethyl-ammonium $CH_3CH_2NH_3^+$, formamidinium $NH_2CH=NH_2^+$ or cesium Cs), a metal cation of carbon family (for example: $Ge^{2+}$, $Sn^{2+}$, $Pb^{2+}$) and a halogen anion (preferably: $F^-$, $Cl^-$, $Br^-$, $I^-$). A particularly preferred perovskite includes lead iodide ($PbI_2$) together with the organic or inorganic cation.

In manufacturing the perovskite precursor solution that is to be infiltrated into the fabricated porous stack of layers forming the perovskite solar cell unit, a solvent is also used (for example GBL, DMSO, DMF, NMP or their mixtures), as well as a compound (5 Ammonium valeric acid iodide or 5-AVAI) or component that is suitable to inhibit, slow down, reduce and/or prevent one or more selected from: nucleation rate, crystal growth and precipitation of perovskite, perovskite crystals and/or a perovskite intermediate phase. Said compound may be referred to as "precipitation retarding compound". This compound may be part of the perovskite to be formed or may not be part of the perovskite to be formed.

This "precipitation retarding compound" typically comprises an anchoring group ("A"), suitable to anchor the compound to the surface of a metal oxide material. preferred anchoring groups (A) are selected from the group consisting of: —COOH, —$CONH_2$, —$PO_3H_2$, —$PO_2H_2R^2$, —$PO_4H_2$, —$SO_3H_2$, —CONHOH, combinations thereof, salts thereof, deprotonated forms thereof, and other derivatives thereof. $R^2$ may be selected from organic substituent comprising from 1-20 carbon atoms and 0-10 heteroatoms, preferably from 1-10 carbon atoms and 0-8 heteroatoms, 1-5 carbon atoms and 0-3 heteroatoms, for example. Alternatively, $R^2$ is a hydrocarbon. Preferably, said heteroatoms are selected from O, S, Se, Te, N, B, P, for example.

In a preferred perovskite, said "precipitation retarding compound" comprises a linker or spaceholder moiety ($R^1$), connecting said anchoring group and said preferably positively charged group, for example said positively charged nitrogen atom. This linker moiety ($R^1$) is preferably an organic moiety comprising 1-20 carbons and 0-10 heteroatoms, preferably 2-12 carbons and 0-7 heteroatoms, more preferably 3-10 carbons and 0-5 heteroatoms, and most preferably 4-8 carbons and 0 heteroatoms. Said organic moiety may be totally or partially halogenated, in addition to said heteroatoms.

Preferred linker moieties are a C1-C20 hydrocarbon, preferably a C2-C15 hydrocarbon, more preferably a C3-C12 hydrocarbon, and most preferably a C4-C8 hydrocarbon.

Particularly, the linker moiety is selected from the group consisting of a C1-C20 alkanediyl, C2-C20 alkynediyl, C2-C20 alkynediyl, C4-C20 heteroaryldiyl, and C6-C20 aryldiyl, preferably C2-C15 alkanediyl, C2-C15 alkynediyl, C2-C15 alkynediyl, C4-C15 heteroaryldiyl, and C6-C15 aryldiyl, more preferably C3-C12 alkanediyl, C3-C12 alkynediyl, C3-C20 alkynediyl, C4-C12 heteroaryldiyl, and C6-C12 aryldiyl, most preferably C4-C8 alkanediyl, C4-C8 alkynediyl, C4-C8 alkynediyl, C4-C8 heteroaryldiyl, and C6-C8 aryldiyl.

The individual components presented in FIGS. 1 and 2 can be replaced by other similar layers. Most importantly, the perovskite solar cell unit should contain an n-type semiconductor layer, a light harvester or sensitizer layer, and an insulating layer, such as $ZrO_2$ or $Al_2O_3$.

The collector typically comprises a material selected from indium doped tin oxide (ITO), fluorine doped tin oxide (FTO), ZnO—$Ga_2O_3$, ZnO—$Al_2O_3$, tin oxide, antimony doped tin oxide (ATO), $SrGeO_3$ and zinc oxide, or combinations thereof.

Suitable semiconductor materials can be selected from metal oxides having the appropriate electronic properties, such as Si, $SiO_2$, $TiO_2$, $Al_2O_3$, $ZrO_2$, $HfO_2$, $SnO_2$, $Fe_2O_3$, ZnO, $WO_3$, $Nb_2O_5$, $In_2O_3$, $Bi_2O_3$, $Y_2O_3$, $Pr_2O_3$, $CeO_2$ and other rare earth metal oxides, CdS, ZnS, PbS, $Bi_2S_3$, CdSe, CdTe, $MgTiO_3$, $SrTiO_3$, $BaTiO_3$, $Al_2TiO_5$, $Bi_4Ti_3O_{12}$ and other titanates, $CaSnO_3$, $SrSnO_3$, $BaSnO_3$, $Bi_2Sn_3O_9$, $Zn_2SnO_4$, $ZnSnO_3$ and other stannates, $CaZrO_3$, $SrZrO_3$, $BaZrO_3$, $Bi_4Zr_3O^{12}$ and other zirconates, combinations of two or more of the aforementioned and other multi-element oxides containing at least two of alkaline metal, alkaline earth metal elements, Al, Ga, In, Si, Ge, Sn, Pb, Sb, Bi, Sc, Y, La or any other lanthanide, Ti, Zr, Hf, Nb, Ta, Mo, W, Ni or Cu.

In an embodiment, the perovskite solar cell unit comprises a surface-increasing structure. In some embodiments, the semiconductor layer or part thereof has a surface increasing structure. The surface-increasing structure may be formed by nanoparticles that are applied on the current collector or on an optional underlayer, such as a dense or compact (preferably n-type) semiconductor layer. If present, the dense underlayer is preferably deposited onto the conductive transparent substrate, and the surface increasing structure is then deposited on top of the dense underlayer.

The dense (or compact) underlayer may be deposited, for example, by slot-coating, screen-printing, sol-gel deposition, spray pyrolysis or inkjet printing. The underlayer and the surface increasing, nanoporous structure preferably comprises the same n-type semiconductor material.

The expression "nanoparticles" encompasses particles or particulate elements, which may have any form, in particular also so-called nanosheets, nanocolumns and/or nanotubes, for example. Preferably, the nanoparticles comprise or consist essentially of said semiconductor material. The surface increasing structure may also be prepared by screen printing, inkjet printing or spin coating, for example as is conventional for the preparation of porous semiconductor (e.g. $TiO_2$) surfaces in heterojunction solar cells.

According to an embodiment of the invention, said surface-increasing structure comprises and/or is prepared from nanoparticles, in particular nanosheets, nanocolumns and/or nanotubes, which nanoparticles are preferably further annealed.

According to an embodiment, the surface-increasing structure and/or said n-type semiconductor is nanostructured and/or nanoporous. In an embodiment, said semiconductor material is mesoporous and/or mesoscopic. According to an embodiment, the surface increasing structure and/or said semiconductor material is nanocrystalline.

Preferably, said surface-increasing structure is provided by said n-type semiconductor material. In some embodiments, the surface increasing structure is not an n-type semiconductor material, but may be, for example, an insulating material. In this case, there is generally the compact underlayer made from n-type semiconductor material, and the surface-increasing structure does not cover the underlayer entirely, such that the perovskite layer can get in contact with the underlayer.

In a preferred embodiment, the porous carbon electrode is deposited before deposition of the perovskite precursor solution, and the precursor solution is deposited onto the carbon so as to infiltrate the latter and to get in contact with the surface increasing structure, preferably filling the pores of the latter.

In an embodiment, a porous insulating or space layer is provided, for example comprising and/or consisting of an insulating material, such as $ZrO_2$, on top of the n-type semiconductor layer. For the purpose of the present invention, an insulating material is a material through which electrons will not flow by electronic motion during operation of the device under normal circumstances.

In an embodiment of the method of the invention, said perovskite precursor solution is deposited per printing/ manually infiltrated or infiltrated via programmable multi-channel pipetting robot the precursor solution on a porous carbon back contact layer so as to infiltrate said porous carbon back contact layer. For example, said porous carbon back contact layer is a porous carbon electrode. The carbon electrode may be deposited by screen printing, for example.

The porous carbon back contact electrode, which may be made, for example, from porous carbon, is typically deposited on top of the space layer. The space layer prevents the carbon back contact electrode to be in direct contact with the n-type semiconductor layer.

Preferably, the space layer is porous, so as to allow access of the perovskite to the semiconductor layer during the perovskite deposition. Preferably, the space layer is meso and/or nanoporous, and deposited by screen printing, for example. Preferably, the space layer is made from nanoparticles, but have larger dimensions compared to the dimensions of the n-type semiconductor nanoparticles. The dimension of the space layer particles are preferably selected such as not to fill up the pores provided by the porous n-type semiconductor layer.

It is believed that the perovskite is in contact with said porous n-type semiconductor, and it is also expected that the perovskite be in contact with said insulting layer and said carbon back contact electrode. The perovskite is thus preferably integrated in the porous n-type semiconductor layer and, if present, said insulating layer, and possibly in part of said porous carbon back contact electrode. In such embodiments, an entire layer consisting exclusively of perovskite may be absent.

In some embodiment, the method of the invention comprises the step of exposing the perovskite, after it has been deposited, to heat, for example one or more heat treatments. Preferably, the perovskite is exposed to 30-80° C. for 5-120 minutes, preferably 35-70° C. for 10-90 minutes, most preferably 40-60° C. for 15-60 minutes.

In some embodiments, one, two or more heating steps are applied, with or without letting the deposited perovskite cool down, for example to room temperature (25° C.) or lower, or to a 10 temperature below the heating temperature, between heating steps. The heating is preferably provided to remove solvent and thereby ensure complete growth of the perovskite crystal. In an embodiment, the deposited perovskite, for example in the completely or partially assembled solar cell, is heated while being in a closed contained, and in a subsequent heating step, the perovskite is heated outside said closed container, allowing for solvent evaporation.

In some embodiments, the perovskite solar cell units are stored in the dark after manufacture, for example for 1 day to 8 weeks, more preferably 2 days to 6 weeks, most preferably 1 week to 5 weeks. Preferably, the cells are stored in vacuum or in an inert atmosphere, that is an atmosphere with reduced or absent moisture ($H_2O$ and oxygen ($O_2$)) during this time. In some embodiments, the storage takes place in a reduced moisture environment, for example an environment which is protected from external moisture. However, these fabricated carbon based perovskite solar cells can also be exposed to a thermo-humid environment (humidity 50%-90% along with temperature 10° C.-90° C.)

to enhance their photovoltaic performance via humidity assisted perovskite crystals growth, as reported by Hashmi et al (2017).

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to one embodiment or an embodiment means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment. Where reference is made to a numerical value using a term such as, for example, about or substantially, the exact numerical value is also disclosed.

As used herein, a plurality of items, structural elements, compositional elements, and/or materials may be presented in a common list for convenience. However, these lists should be construed as though each member of the list is individually identified as a separate and unique member. In addition, various embodiments and examples of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In this description, numerous specific details are provided to provide a thorough understanding of embodiments of the invention. One skilled in the relevant art will recognize, however, that the invention can be practiced without one or more of the specific details.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

According to an embodiment, the thickness of the solar cell assembly is less than 30 millimetres, preferably less than 20 millimetres, such as less than 10 millimetres or even less than 5 or 3 millimetres, wherein the thickness is measured between the outer surfaces of the transparent substrates.

According to an embodiment, the total thickness of the layers between the transparent substrates is less than 500 micrometres, such as less than 200 micrometres or even less than 150 or 100 micrometres.

The following non-limiting example is intended merely to illustrate the advantages obtained with the embodiments of the present invention.

EXAMPLES

Example 1—Manufacture of the Perovskite Solar Cell Unit, Used in the Assembly of the Invention Fluorine doped tin oxide (FTO) coated glass substrates (10×10 cm2, RSH=7 Ω/Sq, Product code: TCO22-7, Solaronix) were first etched with an automated fiber laser, and cleaned by sequential sonications in Hellmanex 1% aqueous solution, acetone, and isopropanol (15 min each). Then a compact layer of $TiO_2$ (30-40 nm) was deposited by spray pyrolysis over the etched glass substrates placed on a hot-plate set to 550° C., of a diluted solution of titanium diisopropoxide bis(acetylacetonate) (75% in isopropanol, Sigma-Aldrich) in absolute ethanol (1:80) using oxygen as a carrier gas. Areas of the substrate had been masked with glass strips to prevent the coating in the subsequent contact (silver) areas. After cooling down to room temperature, a silver paste (Sun Chemical CRSN2442) was screen-printed and dried at 150° C. for 15 min to obtain silver contacts for anode and cathode. The 500 nm thick mesoporous $TiO_2$ layer was obtained by screen-printing (diluted Ti-Nanoxide T/SP in terpineol, Solaronix) on the compact $TiO_2$ layer followed by drying at 150° C. for 5 min, and sintering at 500° C. for 15 min. The substrates were cooled down to room temperature. Similarly, the insulating mesoporous $ZrO_2$ layer was also obtained by screen-printing (Zr Nanoxide ZT/SP, Solaronix) on the aforementioned $TiO_2$ layer followed by drying at 150° C. for 5 min, and sintering at 500° C. for 30 min. The substrates were again cooled down to room temperature. The thickness of the $ZrO_2$ was tuned by stacking 1-4 prints before sintering. The conductive porous carbon electrode was fabricated by screen-printing a carbon paste (Elcocarb B/SP, Solaronix), drying at 150° C. for 5 min, and firing at 400° C. for 30 minutes. The substrates were again cooled down to room temperature before the infiltration of perovskite precursor solution in the porous stack.

INDUSTRIAL APPLICABILITY

The present assembly can be used in new solar cell technologies, which can be utilized in both building-integrated photovoltaic applications, vertically standing or inclined solar panels, and also in consumer electronics and in outdoor solar parks.

The efficiency becomes much higher, from the synergistic effect provided by the two sides of the solar cell assembly.

If installed in a building wall or a window or façade, the outer carbon-based printed perovskite solar cell unit of the double sided solar cell assembly can convert solar energy into electrical energy from facing the sun, whereas the inner side solar cell unit, which can be another carbon-based perovskite solar cell unit or a dye-sensitized solar cell unit, can work efficiently by utilizing the low light intensities from inside the building.

CITATION LIST

Grätzel, Michael, Dye-sensitized solar cells, Journal of Photochemistry and Photobiology C: Photochemistry reviews, Vol 4 (2), 2003, p. 145-153

Hashmi, S. G., Martineau, D., Li, X., Ozkan, M, Tiihonen, A., Dar, M. I., Sarikka, T., Zakeeruddin, S. M., Paltakari, J., Lund, P. D., Grätzel, M., *Air Processed Inkjet Infiltrated Carbon Based Printed Perovskite Solar Cells with High Stability and Reproducibility*, Advanced Material Technologies, Vol 2 (1), 2017

Yiming Cao, Yuhang Liu, Shaik Mohammed Zakeeruddin, Anders Hagfeldt, Michael Grätzel, *Direct Contact of Selective Charge Extraction Layers Enables High-Efficiency Molecular Photovoltaics*, Joule, Volume 2, ISSUE 6, P1108-1117, Jun. 20, 2018

Marina Freitag, Quentin Daniel, Meysam Pazoki, Kári Sveinbjörnsson, Jinbao Zhang, Licheng Sun, Anders Hagfeldta, Gerrit Boschloo, *High-efficiency dye-sensitized solar cells with molecular copper phenanthroline as solid hole conductor*, Energy & Environmental Science, Issue 9, 2015

H. Pettersson et al, Parallel-connected monolithic dye-sensitised solar modules, Prog. Photovolt: Res. Appl. 2010; 18:340-345.

Syed Ghufran Hashmi et al, High performance dye-sensitized solar cells with inkjet printed ionic liquid electrolyte, Nano Energy, 17, 2015, 206-215.

A. Yella et al, Porphyrin-Sensitized Solar Cells with Cobalt (II/III)-Based Redox Electrolyte Exceed 12% Efficiency, Science, (2011), 334, 629-634.

H. Iftikhat et al, Progress on Electrolytes Development in Dye-Sensitized Solar Cells, Materials 2019, 12(12), 1998.

I. Benesperi et al, The researcher's guide to solid-state dye-sensitized solar cells, J. Mater. Chem. C, 2018, 6, 11903-11942.

The invention claimed is:

1. A double sided solar cell assembly, comprising a perovskite solar cell unit having a first electrode comprising a carbon electrode and a second solar cell unit with a second electrode, wherein the carbon electrode and the second electrode are sandwiched between a transparent substrate of the perovskite solar cell unit and a transparent substrate of the second solar cell unit, and wherein the second solar cell unit is a dye-sensitized solar cell unit,
    wherein the perovskite solar cell unit comprises a conductive coating on the transparent substrate and, on top of the conductive coating, a compact layer of semiconductor, a mesoporous layer of semiconductor, an insulating layer, and the carbon electrode, and
    wherein at least the compact layer of semiconductor and the mesoporous layer of semiconductor have been infiltrated by a perovskite material.

2. The solar cell assembly according to claim 1, wherein a material of the conductive coating is selected from the group consisting of indium tin oxide (ITO), fluorine doped tin oxide (FTO), ZnO—$Ga_2O_3$, ZnO—$Al_2O_3$, tin oxide, antimony doped tin oxide (ATO), aluminum doped zinc oxide (AZO), $SrGeO_3$, zinc oxide, and combinations thereof.

3. The solar cell assembly according to claim 1, wherein the insulating layer is selected from a layer of zirconium dioxide ($ZrO_2$) or a layer of aluminium oxide ($Al_2O_3$).

4. The solar cell assembly according to claim 1, wherein the compact and mesoporous layers of semiconductor comprise single element metal oxides, titanates, stannates, zirconates, combinations of two or more of the aforementioned, or multi-element oxides containing at least two of alkaline metal elements, alkaline earth metal elements, or Al, Ga, In, Si, Ge, Sn, Pb, Sb, Bi, Sc, Y, La or any other lanthanide, or Ti, Zr, Hf, Nb, Ta, Mo, W, Ni or Cu.

5. The solar cell assembly according to claim 1, wherein the second solar cell unit comprises a dye-sensitized photoelectrode, which has been soaked with a photosensitizer dye.

6. The solar cell assembly according to claim 1, wherein the second solar cell unit comprises an electrolyte layer composed of one or more electrolytes selected from the group consisting of completely solid state electrolytes, quasi solid state electrolytes, and completely liquid electrolytes, or instead of the electrolyte layer, a layer of organic or inorganic hole transporting material.

7. The solar cell assembly according to claim 1, wherein the second solar cell unit comprises a dye-sensitized photoelectrode, which has been covered by a layer of a photoactive dye.

8. The solar cell assembly according to claim 1, further comprising a sealant material for enclosing sides of the semiconducting layers, wherein the sealant material is selected from a thermoplastic, a double sided tape, or a screen printable epoxy.

9. The solar cell assembly according to claim 6, further comprising a sealant material for enclosing sides of the electrolyte layer or the layer of hole transporting material, wherein the sealant material comprises a member selected from the group consisting of a thermoplastic material, UV curable epoxy, and polydimethylsiloxane (PDMS) containing a curing agent.

10. The solar cell assembly according to claim 1, wherein the perovskite material is an organic-inorganic perovskite, based on an organic or inorganic cation, a metal cation of the carbon family, and a halogen anion.

11. The solar cell assembly according to claim 10, wherein:
    the organic or inorganic cation is selected from a member of the group consisting of methyl-ammonium ($CH_3NH_3^+$), ethyl-ammonium ($CH_3CH_2NH_3^+$), formamidinium ($NH_2CH=NH_2^+$), and cesium ($Cs^+$) ions;
    the metal cation of the carbon family is selected from a member of the group consisting of germanium ($Ge^{2+}$), tin ($Sn^{2+}$), and lead ($Pb^{2+}$) ions; and
    the halogen anion is selected from a member of the group consisting of fluoride ($F^-$), chloride ($Cl^-$), bromide ($Br^-$), and iodide ($I^-$) anions.

12. The solar cell assembly according to claim 1, further comprising a hydrophobic or superhydrophobic layer and an insulating layer between the second solar cell unit and the carbon electrode of the perovskite solar cell unit.

13. The solar cell assembly of claim 12, wherein the second solar cell unit comprises a separate carbon electrode from the carbon electrode perovskite solar cell unit such that the hydrophobic or superhydrophobic layer and the insulating layer between the second solar cell unit and the carbon electrode of the perovskite solar cell unit are sandwiched between the carbon electrode of the perovskite solar cell unit and the separate carbon electrode of the second solar cell unit.

14. The solar cell assembly of claim 12, wherein the insulating layer between the second solar cell unit and the carbon electrode of the perovskite solar cell unit comprises a super hydrophobic layer and a layer of insulating material, and wherein the insulating material comprises an epoxy, zirconium dioxide ($ZrO_2$) or aluminium oxide ($Al_2O_3$), or any other material through which electrons will not flow by electronic motion during operation of the device.

15. The solar cell assembly of claim 13, wherein the insulating layer between the second solar cell unit and the carbon electrode of the perovskite solar cell unit comprises a hydrophobic or super hydrophobic layer and a layer of insulating material, wherein the insulating material comprises a member selected from the group consisting of an epoxy, ethyl cellulose, zirconium dioxide ($ZrO_2$), aluminium oxide ($Al_2O_3$), and polydimethylsiloxane (PDMS) containing a curing agent.

16. The solar cell assembly according to claim 1, wherein the assembly is configured to produce voltage in the perovskite solar cell unit in response to light received through the transparent substrate of the perovskite solar cell unit and produce voltage in the second solar cell unit in response to light received through the transparent substrate of the second solar cell unit.

* * * * *